(12) United States Patent
Segal et al.

(10) Patent No.: US 6,396,523 B1
(45) Date of Patent: May 28, 2002

(54) HOME ENTERTAINMENT DEVICE REMOTE CONTROL

(75) Inventors: Jack A. Segal, Oxnard; William Allen Yates, Camarillo; Steven B. Branton, Ventura; Jeff Mossontte, Oxnard, all of CA (US)

(73) Assignee: Interlink Electronics, Inc., Camarillo, CA (US)

( * ) Notice: Subject to any disclaimer, the term of this patent is extended or adjusted under 35 U.S.C. 154(b) by 0 days.

(21) Appl. No.: 09/524,299

(22) Filed: Mar. 14, 2000

Related U.S. Application Data

(63) Continuation of application No. 09/413,919, filed on Oct. 7, 1999, which is a continuation-in-part of application No. 09/363,177, filed on Jul. 29, 1999.

(51) Int. Cl.⁷ ............................. G09G 5/00; H04N 5/44
(52) U.S. Cl. ..................... 345/863; 345/173; 348/734
(58) Field of Search ................................. 345/156, 157, 345/158, 160, 163, 169, 173, 179, 863, 8; 178/18.01, 18.03, 20.01; 340/825.69; 348/734; 382/195; 341/20, 21, 22, 23, 178

(56) References Cited

U.S. PATENT DOCUMENTS

| | | | |
|---|---|---|---|
| 4,293,734 A | 10/1981 | Pepper, Jr. | |
| 4,455,452 A | 6/1984 | Schuyler | |
| 4,825,209 A | 4/1989 | Sasaki et al. | |
| 4,933,660 A | 6/1990 | Wynne, Jr. | |

(List continued on next page.)

OTHER PUBLICATIONS

Infrared Remote Control Transcoder, Jul. 1983, pp. 317–322.

*Primary Examiner*—Steven Saras
*Assistant Examiner*—Paul A. Bell
(74) *Attorney, Agent, or Firm*—Brooks & Kushman, P.C.

(57) ABSTRACT

A remote control for controlling a home entertainment device having a display screen provided with a movable object includes a touch pad. The touch pad is operable with the display screen such that the display screen is mapped to the touch pad area. The touch pad generates a signal in response to an operator touching the touch pad. The signal is indicative of the location of the touch on the touch pad. A controller is operable with the touch pad for receiving a signal from the touch pad in response to an operator touching the touch pad. In response to an operator touching the touch pad the controller moves the movable object on the display screen to the location on the display screen corresponding to the location of the touch on the touch pad. The touch pad also generates a gesture signal in response to a gesture performed on the touch pad. The gesture signal is indicative of the gesture performed on the touch pad. Each gesture performed on the touch pad corresponds to a control function. The controller is operable with the touch pad for receiving a gesture signal from the touch pad in response to an operator performing a gesture on the touch pad. In response to an operator performing a gesture on the touch pad the controller controls the home entertainment device to enable the control function corresponding to the gesture performed on the touch pad.

32 Claims, 3 Drawing Sheets

U.S. PATENT DOCUMENTS

| | | |
|---|---|---|
| 4,981,370 A | 1/1991 | Dziewit et al. |
| 4,988,982 A | 1/1991 | Rayner et al. |
| 5,031,214 A | 7/1991 | Dziewit et al. |
| 5,038,401 A | 8/1991 | Inotsume |
| 5,086,385 A * | 2/1992 | Launey et al. ......... 340/825.69 |
| 5,134,388 A | 7/1992 | Murakami et al. |
| 5,162,783 A | 11/1992 | Moreno |
| 5,163,091 A | 11/1992 | Graziano et al. |
| 5,191,613 A | 3/1993 | Graziano et al. |
| 5,208,736 A | 5/1993 | Crooks et al. |
| 5,250,929 A | 10/1993 | Hoffman et al. |
| 5,252,951 A * | 10/1993 | Tannenbaum et al. ...... 345/173 |
| 5,311,207 A | 5/1994 | Kusumoto et al. |
| 5,450,079 A | 9/1995 | Dunaway |
| 5,502,803 A * | 3/1996 | Yoshida et al. ............. 707/530 |
| 5,545,857 A | 8/1996 | Lee et al. |
| 5,570,113 A * | 10/1996 | Zetts ......................... 345/173 |
| 5,612,719 A | 3/1997 | Beernink et al. |
| 5,745,116 A | 4/1998 | Pisutha-Arnold |
| 5,745,719 A * | 4/1998 | Falcon ....................... 345/856 |
| 5,748,185 A | 5/1998 | Stephan et al. |
| 5,777,605 A | 7/1998 | Yoshinobu et al. |
| 5,784,504 A * | 7/1998 | Anderson et al. ........... 345/173 |
| 5,787,254 A | 7/1998 | Maddalozzo, Jr. |
| 5,796,406 A | 8/1998 | Shigematsu et al. |
| 5,798,758 A | 8/1998 | Harada et al. |
| 5,809,267 A | 9/1998 | Moran et al. |
| 5,818,425 A | 10/1998 | Want et al. |
| 5,825,352 A | 10/1998 | Bisset et al. |
| 5,862,256 A | 1/1999 | Zetts et al. |
| 5,864,635 A | 1/1999 | Zetts et al. |
| 5,880,411 A | 3/1999 | Gillespie et al. |
| 5,889,236 A | 3/1999 | Gillespie et al. |
| 5,905,497 A | 5/1999 | Vaughan et al. |
| 5,909,211 A | 6/1999 | Combs et al. |
| 5,917,475 A | 6/1999 | Kuzunuki et al. |
| 5,943,044 A | 8/1999 | Martinelli et al. |
| 5,956,019 A | 9/1999 | Bang et al. |
| 5,956,025 A * | 9/1999 | Goulden et al. ............ 345/716 |
| 5,990,893 A | 11/1999 | Numazaki |
| 6,005,549 A | 12/1999 | Forest |
| 6,020,881 A * | 2/2000 | Naughton et al. .......... 345/863 |
| 6,029,214 A | 2/2000 | Dorfman et al. |
| 6,057,845 A * | 5/2000 | Dupouy ..................... 345/358 |
| 6,072,470 A * | 6/2000 | Ishigaki ..................... 348/734 |
| 6,157,372 A * | 12/2000 | Blackburn et al. .......... 345/173 |
| 6,229,541 B1 | 5/2001 | Kamen et al. |
| 6,249,606 B1 * | 6/2001 | Kiraly et al. ................ 382/195 |
| 6,313,853 B1 * | 11/2001 | Lamontagne et al. ....... 345/863 |

* cited by examiner

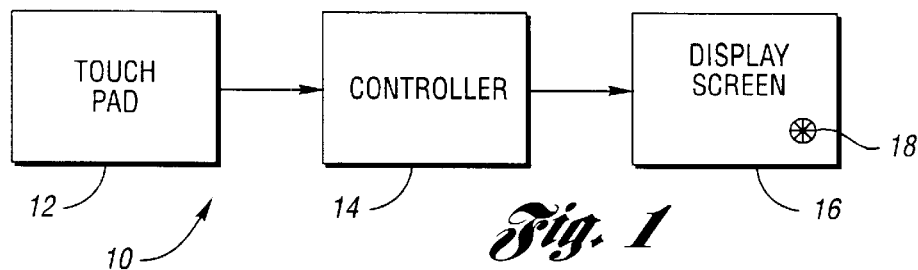

*Fig. 1*

| LINE | FUNCTION | GESTURE SET ONE | GESTURE SET TWO |
|---|---|---|---|
| 1 | VOLUME UP (REPEATING) | →H | → T |
| 2 | VOLUME DOWN (REPEATING) | H← | ← T |
| 3 | MUTE | ∧∧↘ | ∧∧↘ |
| 4 | CHANNEL UP (REPEATING) | ↕H | ∧ T |
| 5 | UP ONE CHANNEL | ∧ | |
| 6 | CHANNEL DOWN (REPEATING) | ↕H | ∨ T |
| 7 | DOWN ONE CHANNEL | ∨ | |
| 8 | PREVIOUS CHANNEL | ← | ← |
| 9 | PLAY | → | > |
| 10 | PAUSE | T T | T T |
| 11 | STOP | T | T |
| 12 | FAST FORWARD | →→ | >> |
| 13 | FAST REVERSE (REWIND) | ←← | << |
| 14 | RECORD | ⊙T ⊙T | ↑↑ / ▭↑ OR ↑ |
| 15 | SKIP | → T | > T |
| 16 | REPLAY | ← T | < T |
| 17 | NEXT TRACK | →→ T | >> T |
| 18 | PREVIOUS TRACK | ←← T | << T |

*Fig. 2*

HOME ENTERTAINMENT DEVICE REMOTE CONTROL

CROSS-REFERENCE TO RELATED APPLICATIONS

This application is a continuation of U.S. patent application Ser. No. 09/413,919, filed on Oct. 7, 1999, which is a continuation-in-part application of U.S. patent application Ser. No. 09/363,177, filed on Jul. 29, 1999, entitled "Remote Computer Input Peripheral."

TECHNICAL FIELD

The present invention generally relates to remote controls for controlling home entertainment devices and, more particularly, to a remote control having a touch pad for controlling a home entertainment device.

BACKGROUND ART

Other than being remote, home entertainment (HE) device remote controls are generally despised by human operators for a variety of reasons. There are many reasons why HE remote controls are not liked. HE remote controls are based on a button-centric paradigm and usually contain too many buttons, This crowded geography causes considerable confusion and intimidation and makes it difficult to find the desired button. It is often dark in the room in which HE remote controls are used. This makes it difficult or impossible to read the legends on the crowded button layout.

Normal home entertainment viewing takes place at a distance of 3 meters or more and the display being viewed is usually quite large such as a TV having a diagonal viewing surface falling between 27" to 72". The legends on HE remote controls are usually twelve point type or smaller. For many operators, changing viewing distance requires changing glasses or putting on reading glasses.

Enhanced TV and related applications require the extensive use of graphic user interfaces (GUI) and on-screen displays/menus. An enhanced TV is a TV configured for cable video programming, Internet browsing, Internet telephony, video cassette recording, stereo receiving, and the like. The operator has to navigate through various menus to use enhanced TV. Using up, down, right, and left arrow keys to navigate these menus is difficult, slow, and frustrating. The increasing number of television channels has given rise to the electronic program guide (EPG). Because an EPG is a dense grid of selections, using arrow keys to navigate is even more difficult.

Interactive television requires text entry. The current solution, a wireless keyboard, is undesirable in a living room because many people cannot type, the keyboard does not fit the decor of the living room, there is no place to set the keyboard down to type on it, and people simply refuse to have computer related material in living rooms. In addition, typing is associated with work and is not desired to be in a room devoted to entertainment.

SUMMARY OF THE INVENTION

Accordingly, it is an object of the present invention to provide a remote control having a touch pad that recognizes gestures performed on the touch pad for controlling a home entertainment (HE) device.

It is another object of the present invention to provide a remote control having a touch pad operable with a display screen for displaying a gesture performed on the touch pad.

It is a further object of the present invention to provide an HE remote control having a touch pad operable with a display screen for displaying a gesture performed on the touch pad in which the display screen is mapped to the touch pad so that a gesture performed on the touch pad surface area is scaled correspondingly on to the display screen.

It is still another object of the present invention to provide an HE remote control having a touch pad operable with a display screen for providing an indication of an enabled home entertainment device control function corresponding to a gesture performed on the touch pad.

It is still a further object of the present invention to provide an HE remote control having a touch pad operable with a home entertainment device display screen provided with a movable object such that in response to an operator touching the touch pad the movable object is moved to the location of the display screen corresponding to the location of the touch on the touch pad.

It is still yet another object of the present invention to provide an HE remote control having a touch pad operable with a home entertainment device display screen provided with a movable object such that in response to an operator touching the touch pad the movable object is moved to the location of the display screen corresponding to the location of the touch on the touch pad thereby enabling a control function corresponding to the location of the movable object on the display screen for controlling an HE device.

It is still yet a further object of the present invention to provide an HE remote control having a touch pad operable with a display screen provided with an electronic program guide listing programming choices.

Still, it is still yet another object of the present invention to provide an HE remote control having a touch pad operable with a display screen provided with a menu listing control functions for an HE device.

Still, it is still a further object of the present invention to provide an HE remote control having a touch pad operable with a keyboard provided with alphanumeric keys for controlling an HE device.

In carrying out the above objects and other objects, the present invention provides a remote control for controlling a home entertainment device. The remote control includes a touch pad having a surface area for an operator to touch for performing a gesture thereon. The touch pad generates a signal in response to a gesture performed on the touch pad surface area. The signal is indicative of the gesture performed on the touch pad surface area. Each gesture performed on the touch pad surface area corresponds to a home entertainment device control function. A controller is operable with the touch pad for receiving a signal from the touch pad in response to a gesture performed on the touch pad surface area. In response to receiving a signal from the touch pad the controller controls the home entertainment device to enable the control function corresponding to the gesture performed on the touch pad surface area.

Further, in carrying out the above objects and other objects, the present invention provides a remote control for controlling a home entertainment device having a display screen provided with a movable object. The remote control includes a touch pad having a surface area for an operator to touch. The touch pad is operable with the display screen such that the display screen is mapped to the touch pad surface area. The touch pad generates a signal in response to an operator touching the touch pad surface area. The signal is indicative of the location of the touch on the touch pad surface area. A controller is operable with the touch pad for receiving a signal from the touch pad in response to an operator touching the touch pad surface area. In response to an operator touching the touch pad surface area the controller moves the movable object on the display screen to the location on the display screen corresponding to the location of the touch on the touch pad surface area.

These and other features, aspects, and embodiments of the present invention will become better understood with regard to the following description, appended claims, and accompanying drawings.

BRIEF DESCRIPTION OF THE DRAWINGS

FIG. 1 is a block diagram of a remote control for controlling a home entertainment device in accordance with the present invention;

FIG. 2 illustrates a table showing two gesture sets with corresponding home entertainment device control functions;

BEST MODES FOR CARRYING OUT THE INVENTION

Figure 3:
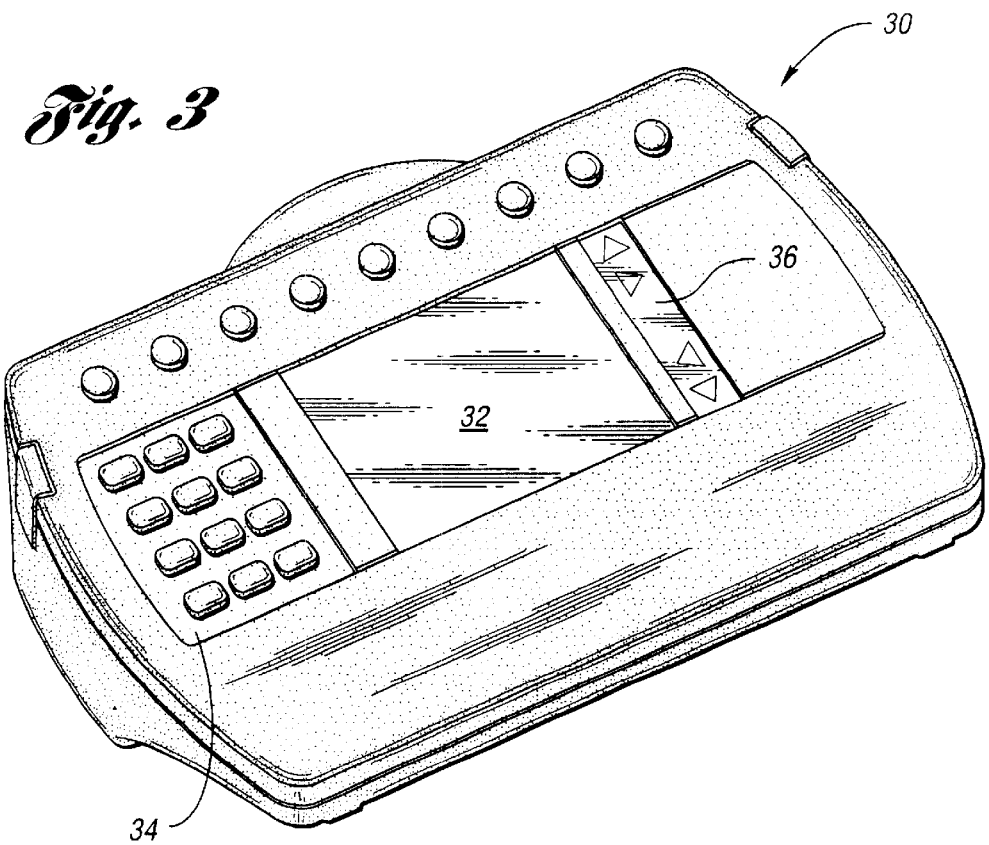
FIG. 3 illustrates a perspective view of a remote control for controlling a home entertainment device in accordance with the present invention.

Referring now to FIG. 1, a block diagram of a remote control 10 for controlling a home entertainment device in accordance with the present invention is shown. Remote control 10 includes a touch pad 12, a controller 14, and a display screen 16. Touch pad 12 includes a touch pad surface area for an operator to touch. Touch pad 12 generates a signal in response to touching by an operator on the touch pad. The signal is indicative of the location of the touch on the touch pad. The signal may also be indicative of the duration and the pressure of the touch on the touch pad for each location being touched.

Touch pad 12 is operable with display screen 16 such that the display screen is mapped to the touch pad. Preferably, display screen 16 has a larger area than the area of touch pad 12 and the mapping is scaled as a function of the ratio of the areas. Each location on touch pad 12 has a corresponding location on display screen 16. Display screen 16 is preferably the display screen used by a home entertainment device such as a television screen. Display screen 16 includes a movable object 18. Display screen 16 may be separated from the home entertainment device and coupled directly to touch pad 12.

Controller 14 is operable with touch pad 12 for receiving a signal from the touch pad in response to an operator touching the touch pad. Controller 14 moves movable object 18 on display screen 16 to the location on the display screen corresponding to the location of the touch on touch pad 12 in response to an operator touching the touch pad. Controller 12 controls the home entertainment device to enable a control function corresponding to the location of movable object 18 on display screen 16 in response to an operator touching touch pad 12. Controller 14 may be coupled directly or remotely located from touch pad 12. If remotely located, touch pad 12 transmits infrared signals to communicate with controller 14.

Preferably, controller 14 moves movable object 12 on display screen 16 to the location on the display screen corresponding to the location of the touch on touch pad 12 independent of the location of the movable object on the display screen prior to the touch on the touch pad. Thus, touch pad 12 is based on absolute pointing. This means that wherever the operator touches touch pad 12 movable object 18 moves to the corresponding location on display screen 16, regardless of the location of the movable object prior to the touch. That is, the touching movement of the operator on touch pad 12 is mapped absolutely on to display screen 16. Traditional pointing devices such as a computer mouse use relative pointing letting the operator move a cursor from one place to another place on a display screen. That is, the movement of the operator is mapped relative to the location from where the operator moved.

The operator may touch pad 12 to perform a gesture thereon. A gesture performed on touch pad 12 is a touch that corresponds to an understood or recognizable pattern. In response to a gesture performed on touch pad 12, the touch pad generates a gesture signal. The gesture signal is indicative of the gesture performed on the touch pad. Each gesture performed on touch pad 12 corresponds to a home entertainment device control function. Controller 14 is operable with touch pad 12 for receiving a gesture signal from the touch pad in response to an operator performing a gesture on the touch pad. In response to an operator performing a gesture on touch pad 12 controller 14 controls the home entertainment device to enable the control function corresponding to the gesture performed on the touch pad.

Referring now to FIG. 2, a table 20 illustrating two sets of gestures 22, 24 is shown. Gestures 22,24 correspond to a set of home entertainment device control functions 26. The set of home entertainment device control functions 26 are used for controlling a television and a video cassette recorder (VCR). For instance, a gesture may be a stroke from right to left on touch pad 12 as shown in line 9 of gesture set 22. This gesture corresponds to a control function for playing the VCR. Another gesture may be a stroke from left to right on touch pad 12 as shown in line 8 of gesture set 22. This gesture corresponds to a control function for changing the channel on the television to the previous channel.

A stroke on touch pad 12 constitutes all of the points crossed by an operator's finger or stylus on the touch pad while the finger or stylus is in continuous contact with the touch pad. Where the stroke has an X and Y displacement, the direction of the displacement is indicated in FIG. 2 by the arrowhead at the end of the stroke. A "T" enclosed in a square represents a tap on touch pad 12. An "H" enclosed in a square represents a hold on touch pad 12. Both the tap and hold do not have X and Y components. The tap and hold are differentiated from one another by time. A tap is an instantaneous touch on touch pad 12. A hold is a non-instantaneous touch on touch pad 12.

For example, a gesture may be a stroke from the right to the left followed by a hold as shown in line 2 of gesture set 22. This gesture corresponds to a control function for turning up the volume of the television. A gesture may be a tap as shown in line 11 of gesture set 22. This gesture corresponds to stopping the VCR. Similarly, a gesture may be a series of taps as shown in line 10 of gesture sets 21, 22. This gesture corresponds to pausing the VCR.

In general, gestures include one or more strokes. Multi-stroke gestures are shown in FIG. 2 in the order the strokes are performed on touch pad 12. Recognition of a gesture by touch pad 12 does not depend on the relative position of successive strokes on the touch pad. Of course, alternate gesture sets may be used to replace the gesture sets shown or to correspond with different home entertainment device control functions.

Gestures may also be alphanumeric characters traced on touch pad 12. For instance, an operator may trace "9" on touch pad 12 to change the television channel to channel "9". The operator may also trace "M" to mute the volume of the television or trace "P" to play the VCR.

Using gestures to control home entertainment devices has many advantages. The operator has access to commands with no need to look at remote control 10. Gestures decrease the number of buttons on remote control 10. Remote control 10 can be upgraded simply by adding recognizable gestures. Hardware changes are not required meaning that there is no need to add, subtract, or change physical buttons or legends.

Referring now to FIG. 3, a perspective view of a remote control 30 for controlling home entertainment devices in accordance with the present invention is shown. Remote control 30 includes a touch pad surface area 32, a plurality of exposed control buttons 34, and a plurality of embedded control buttons 36. Control buttons 34 and 36 are used in conjunction with touch pad 12 and are operable with controller 12 for selecting a control function for controlling a home entertainment device.

In general, an operator uses touch pad 12 to point or move movable object 18 to an on screen option displayed on display screen 16. The operator then uses control buttons 34 and 36 to select the option being pointed at by movable object 18 on display screen 16. Remote control 30 is useful for harmonious bimodal operation. In this mode, the operator uses one hand on touch pad 12 to point to an option on display screen 16. The operator uses the other hand to hold remote control 30 and to make a selection by actuating a control button 34, 36.

Remote control 30 may also be configured for one handed operation. In this mode, control buttons 34, 36 are not needed. One handed operation allows the operator to keep one hand free for other purposes. For instance, to hold a drink while watching television. To select an option, one finger is used on touch pad 12 to point to an option while another finger on the touch pad is used on the touch pad to select the option. Another way to select an option is to have one finger on touch pad 12 to point to an option and then lifting that finger from the touch pad to select the option.

Figure 4:
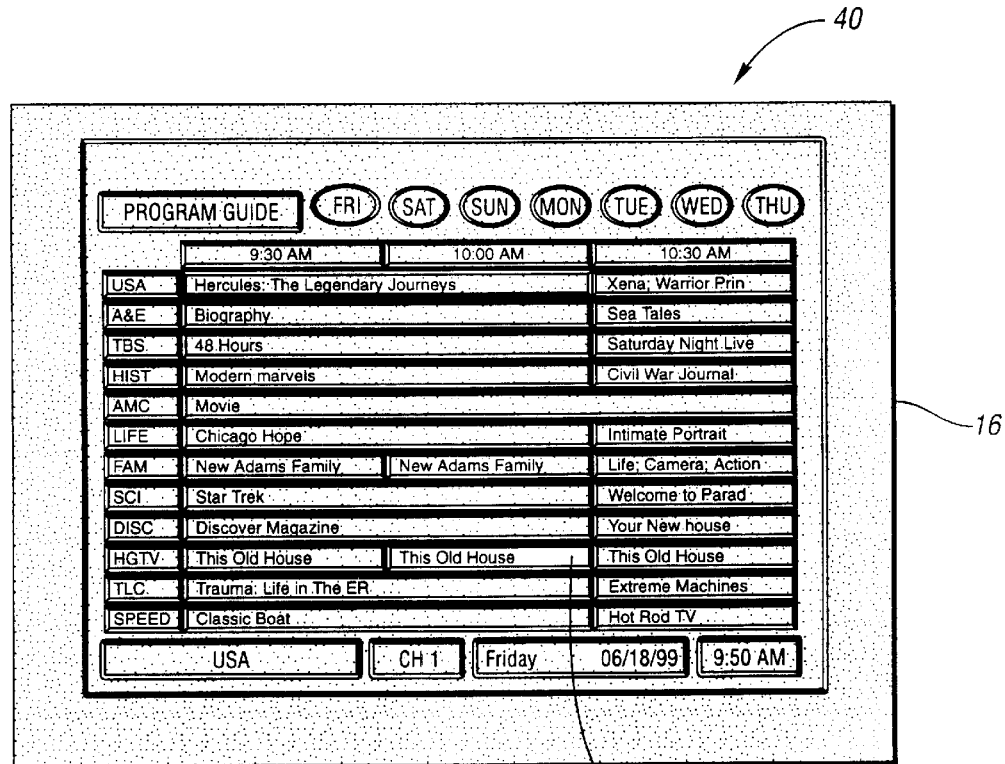
FIG. 4 illustrates an electronic program guide displayed on a display screen operable with the remote control for controlling a home entertainment device.

Referring now to FIG. 4, an electronic program guide (EPG) 40 displayed on display screen 16 is shown. EPG 40 lists programming choices 42. EPG 40 is displayed in a grid form with television channels displayed from top to bottom with program start times from left to right. EPG 40 is mapped to touch pad 12. When EPG 40 first appears on display screen 16, the current channel is highlighted. When the operator touches touch pad 12, the directly corresponding program on display screen 16 is highlighted. For example, if the operator touches the center of touch pad 12 then the program nearest the center of display screen 16, i.e., EPG 40, becomes highlighted. If the operator touches the extreme upper left corner of touch pad 12, the upper most, left most program becomes highlighted.

If the operator slides his finger to a different area of touch pad 12, the currently highlighted program stays highlighted until the finger reaches an area of the touch pad that corresponds to a different program. The different program is then highlighted. When the operator reaches the desired program, he may use one of the selecting methods described above to select the program or perform a control function. If the operator lifts his finger from touch pad 12 and touches a different area, another directly corresponding area is highlighted.

Figure 5:
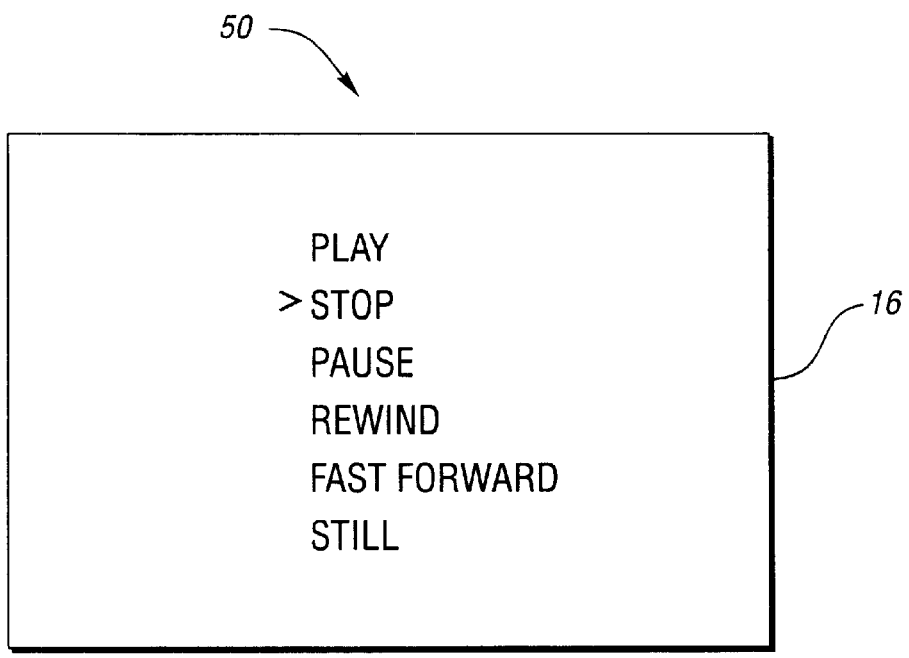
FIG. 5 illustrates a menu listing control functions or menu options for controlling a home entertainment device.

Referring now to FIG. 5, a menu 50 listing control functions or menu options for a home entertainment device such as a VCR is shown. As shown in FIG. 5, the VCR control functions or menu options include Play, Stop, Pause, etc. Menu 50 is mapped to touch pad 12. When an operator touches touch pad 12, the directly corresponding menu option is highlighted. For example, if the operator touches the center of touch pad 12, the menu option nearest the center of display screen 16 becomes highlighted. In general, highlighting and selecting control functions for menu 50 is performed similarly with respect to the highlighting and selecting methods associated with EPG 40. The advantages of using touch pad 12 for selecting options in menu 50 is that it is easier and faster to use than arrow keys or mouse/cursor menus; it decreases the button clutter that some button menus suffer from; and it is not necessary to look at the remote control to select an option.

Figure 6:
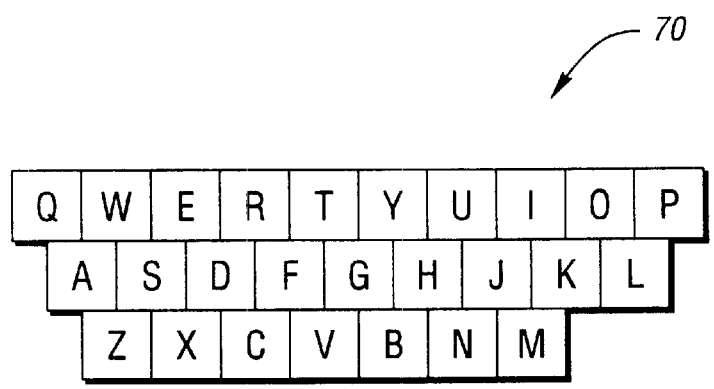
FIG. 6 illustrates a keyboard having alphanumeric keys for controlling a home entertainment device.

Referring now to FIG. 6, a keyboard 70 having alphanumeric keys for a home entertainment device is shown. Keyboard 70 is mapped to touch pad 12. When an operator touches touch pad 12, the directly corresponding keyboard key is highlighted. For example, if the operator touches the center of touch pad 12, the "G" becomes highlighted. If the operator touches the upper left corner of touch pad 12, then "Q" becomes highlighted. Preferably, there are two ways to use keyboard 70. The first method is based on harmonious bimodal operation. An operator places his finger on touch pad 12 and then slides his finger until the desired key is highlighted. The operator then selects the desired key by pressing a control button 34, 36 without lifting his finger from touch pad 12. In the second method, the operator places his finger onto touch pad 12 as close as possible to the area corresponding to the desired key. The operator then lifts his finger from touch pad 12 to select the desired key.

Thus it is apparent that there has been provided, in accordance with the present invention, a remote control for controlling a home entertainment device that fully satisfies the objects, aims, and advantages set forth above. While the present invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A method of controlling a home entertainment device, the method comprising:

receiving at least one stroke on a touch pad of a remote control, the at least one stroke forming at least one gesture, wherein a first one of the at least one stroke forms a first gesture being a stroke from left to right on the touch pad;

generating at least one gesture signal each respectively representing the at least one gesture;

determining at least one home entertainment device control operation based on each respective at least one gesture signal, wherein a determined control operation for the gesture signal representing the first gesture includes playing recorded information; and generating at least one control signal for the home entertainment device based on each respective determined control operation.

2. The method of claim 1 wherein:

a second one of the at least one stroke forms a second gesture being a sequence including a first stroke down and to the right on the touch pad and a second stroke down and to the left on the touch pad, wherein a determined control operation for the gesture signal representing the second gesture includes playing recorded information.

3. The method of claim 1 wherein:
a second one of the at least one stroke forms a second gesture being a sequence including first and second taps on the touch pad, wherein a determined control operation for the gesture signal representing the second gesture includes pausing recorded information.

4. The method of claim 1 wherein:
a second one of the at least one stroke forms a second gesture being a tap on the touch pad, wherein a determined control operation for the gesture signal representing the second gesture includes stopping recorded information.

5. The method of claim 1 wherein:
a second one of the at least one stroke forms a second gesture being a series of discrete strokes including a first stroke from left to right on the touch pad and a second stroke from left to right on the touch pad, wherein a determined control operation for the gesture signal representing the second gesture includes fast forwarding recorded information.

6. The method of claim 1 wherein:
a second one of the at least one stroke forms a second gesture being a series of discrete strokes including a first sequence having a first stroke down and to the right on the touch pad and a second stroke down and to the left on the touch pad, and a second sequence having a first stroke down and to the right on the touch pad and a second stroke down and to the left on the touch pad, wherein a determined control operation for the gesture signal representing the second gesture includes fast forwarding recorded information.

7. The method of claim 1 wherein:
a second one of the at least one stroke forms a second gesture being a series of discrete strokes including a first stroke from right to left on the touch pad and a second stroke from right to left on the touch pad, wherein a determined control operation for the gesture signal representing the second gesture includes fast rewinding recorded information.

8. The method of claim 1 wherein:
a second one of the at least one stroke forms a second gesture being a series of discrete strokes including a first sequence having a first stroke down and to the left on the touch pad and a second stroke down and to the right on the touch pad, and a second sequence having a first stroke down and to the left on the touch pad and a second stroke down and to the right on the touch pad, wherein a determined control operation for the gesture signal representing the second gesture includes fast rewinding recorded information.

9. The method of claim 1 wherein:
a second one of the at least one stroke forms a second gesture being a series discrete strokes including a first sequence having a circle traced in a counterclockwise direction on the touch pad and a tap on the touch pad, and a second sequence having a circle traced in a clockwise direction on the touch pad and a tap on the touch pad, wherein a determined control operation for the gesture signal representing the second gesture includes recording information.

10. The method of claim 1 wherein:
a second one of the at least one stroke forms a second gesture being a series of discrete strokes including a first stroke from down to up on the touch pad and a second stroke from down to up on the touch pad, wherein a determined control operation for the gesture signal representing the second gesture includes recording information.

11. The method of claim 1 wherein:
a second one of the at least one stroke forms a second gesture being a sequence including a first stroke from right to left on the touch pad, a second stroke from up to down on the touch pad, a third stroke from left to right on the touch pad, and a fourth stroke from down to up on the touch pad, wherein a determined control operation for the gesture signal representing the second gesture includes recording information.

12. The method of claim 1 wherein:
a second one of the at least one stroke forms a second gesture being a sequence including a first stroke from left to right on the touch pad and then a tap on the touch pad, wherein a determined control operation for the gesture signal representing the second gesture includes skipping recorded information.

13. The method of claim 1 wherein:
a second one of the at least one stroke forms a second gesture being a sequence including a first stroke down and to the right on the touch pad, a second stroke down and to the left on the touch pad, and a tap on the touch pad, wherein a determined control operation for the gesture signal representing the second gesture includes skipping recorded information.

14. The method of claim 1 wherein:
a second one of the at least one stroke forms a second gesture being a sequence including a first stroke from right to left on the touch pad and then a tap on the touch pad, wherein a determined control operation for the gesture signal representing the second gesture includes replaying recorded information.

15. The method of claim 1 wherein:
a second one of the at least one stroke forms a second gesture being a sequence including a first stroke down and to the left on the touch pad, a second stroke down and to the right on the touch pad, and then a tap on the touch pad, wherein a determined control operation for the gesture signal representing the second gesture includes replaying recorded information.

16. A method of controlling a home entertainment device, the method comprising:
receiving at least one stroke on a touch pad of a remote control, the at least one stroke forming at least one gesture, wherein a first one of the at least one stroke forms a first gesture being a sequence including a stroke from left to right on the touch pad and then a continuous touch on the touch pad for more than a predetermined time period;
generating at least one gesture signal each respectively representing the at least one gesture;
determining at least one home entertainment device control operation based on each respective at least one gesture signal, wherein a determined control operation for the gesture signal representing the first gesture includes raising the audible signal volume of the home entertainment device; and
generating at least one control signal for the home entertainment device based on each respective determined control operation.

17. The method of claim 16 wherein:
a second one of the at least one stroke forms a second gesture being a sequence including a stroke from left to right on the touch pad and then a tap on the touch pad, wherein a determined control operation for the gesture signal representing the second gesture includes raising audible signal volume.

18. The method of claim 16 wherein:
a second one of the at least one stroke forms a second gesture being a sequence including a stroke from right to left on the touch pad and then a continuous touch on the touch pad for more than a predetermined time period, wherein a determined control operation for the gesture signal representing the second gesture includes lowering the audible signal volume of the home entertainment device.

19. The method of claim 16 wherein:
a second one of the at least one stroke forms a second gesture being a sequence including a stroke from right to left on the touch pad and then a tap on the touch pad, wherein a determined control operation for the gesture signal representing the second gesture includes lowering the audible signal volume of the home entertainment device.

20. The method of claim 16 wherein:
a second one of the at least one stroke forms a second gesture being a sequence including a first stroke up and to the right on the touch pad, a second stroke down and to the right on the touch pad, a third stroke up and to the right on the touch pad, and a fourth stroke down and to the right on the touch pad, wherein a determined control operation for the gesture signal representing the second gesture includes muting the audible signal volume of the home entertainment device.

21. A method of controlling a home entertainment device, the method comprising:
receiving at least one stroke on a touch pad of a remote control, the at least one stroke forming at least one gesture, wherein a first one of the at least one stroke forms a first gesture being a sequence including a stroke from down to up on the touch pad and then a continuous touch on the touch pad for more than a predetermined time period;
generating at least one gesture signal each respectively representing the at least one gesture;
determining at least one home entertainment device control operation based on each respective at least one gesture signal, wherein a determined control operation for the gesture signal representing the first gesture includes changing the channel of the home entertainment device upward; and
generating at least one control signal for the home entertainment device based on each respective determined control operation.

22. The method of claim 21 wherein:
a second one of the at least one stroke forms a second gesture being a sequence including a first stroke up and to the right on the touch pad, a second stroke down and to the right on the touch pad, and a tap on the touch pad, wherein a determined control operation for the gesture signal representing the second gesture includes changing the channel of the home entertainment device upward.

23. The method of claimed 21 wherein:
a second one of the at least one stroke forms a second gesture being a sequence including a first stroke up and to the right on the touch pad and a second stroke down and to the right on the touch pad, wherein a determined control operation for the gesture signal representing the second gesture includes changing the channel of the home entertainment device upward.

24. The method of claim 21 wherein:
a second one of the at least one stroke forms a second gesture being a sequence including a stroke from up to down on the touch pad and then a continuous touch on the touch pad for more than a predetermined time period, wherein a determined control operation for the gesture signal representing the second gesture includes changing the channel of the home entertainment device downward.

25. The method of claim 21 wherein:
a second one of the at least one stroke forms a second gesture being a sequence including a first stroke down and to the right on the touch pad, a second stroke up and to the right on the touch pad, and a tap on the touch pad, wherein a determined control operation for the gesture signal representing the second gesture includes changing the channel of the home entertainment device downward.

26. The method of claim 21 wherein:
a second one of the at least one stroke forms a second gesture being a sequence including a first stroke down and to the right on the touch pad and a second stroke up and to the right on the touch pad, wherein a determined control operation for the gesture signal representing the second gesture includes changing the channel of the home entertainment device downward.

27. The method of claim 21 wherein:
a second one of the at least one stroke forms a second gesture being a stroke from right to left, wherein the determined control operation includes changing a channel of the home entertainment device to a previous channel.

28. The method of claim 21 wherein:
a second one of the at least one stroke forms a second gesture being a sequence including a first stroke down and to the left on the touch pad and a second stroke down and to the right on the touch pad, wherein the determined control operation includes changing a channel of the home entertainment device to a previous channel.

29. A method of controlling a home entertainment device, the method comprising:
receiving at least one stroke on a touch pad of a remote control, the at least one stroke forming at least one gesture, wherein a first one of the at least one stroke forms a first gesture being a series of discrete strokes including a first stroke from left to right on the touch pad and a second stroke from left to right on the touch pad, and then a tap on the touch pad;
generating at least one gesture signal each respectively representing the at least one gesture;
determining at least one home entertainment device control operation based on each respective at least one gesture signal, wherein a determined control operation for the gesture signal representing the first gesture includes changing a track of the home entertainment device to a higher track; and
generating at least one control signal for the home entertainment device based on each respective determined control operation.

30. The method of claim 29 wherein:

a second one of the at least one stroke forms a second gesture being a series of discrete stokes including a first stroke sequence having a first stroke down and to the right on the touch pad and a second stroke down and to the left on the touch pad, and a second stroke sequence having a first stroke down and to the left on the touch pad and a second stroke down and to left on the touch pad, and then a tap on the touch pad, wherein a determined control operation for the gesture signal representing the second gesture includes changing a track of the home entertainment device to a higher track.

31. The method of claim 29 wherein:

a second one of the at least one stroke forms a second gesture being a series of discrete strokes including a first stroke from right to left on the touch pad and a second stroke from right to left on the touch pad, and then a tap on the touch pad, wherein a determined control operation for the gesture signal representing the second gesture includes changing a track of the home entertainment device to a lower track.

32. The method of claim 29 wherein:

a second one of the at least one stroke forms a second gesture being a series of discrete stokes including a first stroke sequence having a first stroke down and to the left on the touch pad and a second stroke down and to the right on the touch pad, and a second stroke sequence having a first stroke down and to the left on the touch pad and a second stroke down and to right on the touch pad, and then a tap on the touch pad, wherein a determined control operation for the gesture signal representing the second gesture includes changing a track of the home entertainment device to a lower track.

* * * * *